(12) United States Patent
Tang

(10) Patent No.: US 9,935,157 B2
(45) Date of Patent: Apr. 3, 2018

(54) OLED DISPLAY

(71) Applicant: Wuhan China Star Optoelectronics Technology Co., Ltd., Wuhan, Hubei (CN)

(72) Inventor: Yuejun Tang, Guangdong (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 38 days.

(21) Appl. No.: 15/201,488

(22) Filed: Jul. 3, 2016

(65) Prior Publication Data

US 2017/0338284 A1 Nov. 23, 2017

(30) Foreign Application Priority Data

May 18, 2016 (CN) ...................... 2016 2 0455715 U

(51) Int. Cl.
*H01L 27/32* (2006.01)
*H01L 51/52* (2006.01)

(52) U.S. Cl.
CPC ........ *H01L 27/322* (2013.01); *H01L 27/3244* (2013.01); *H01L 51/5237* (2013.01)

(58) Field of Classification Search
None
See application file for complete search history.

(56) References Cited

U.S. PATENT DOCUMENTS

| | | | | |
|---|---|---|---|---|
| 8,759,823 B2* | 6/2014 | Lee | .......................... | H01L 51/52 257/40 |
| 9,082,730 B2* | 7/2015 | Ogata | .................... | H01L 27/322 |
| 9,167,234 B2* | 10/2015 | Hirakata | ............ | H04N 13/0409 |
| 9,207,504 B2* | 12/2015 | Kimura | .............. | G02F 1/134363 |
| 9,318,726 B2* | 4/2016 | Choi | .................... | H01L 51/5275 |
| 9,331,100 B2* | 5/2016 | Yamazaki | ........... | H01L 27/1225 |
| 9,553,114 B2* | 1/2017 | Nakada | ................ | H01L 27/1255 |
| 9,612,377 B2* | 4/2017 | Chen | ..................... | G02B 5/3033 |
| 9,627,452 B2* | 4/2017 | Lim | ...................... | H01L 27/322 |
| 9,627,456 B2* | 4/2017 | Park | ..................... | H01L 27/3232 |
| 2003/0127968 A1* | 7/2003 | Kuma | .................... | H01L 27/322 313/503 |
| 2006/0038752 A1* | 2/2006 | Winters | ............... | G09G 3/3225 345/76 |
| 2009/0072709 A1* | 3/2009 | Kobayashi | .......... | H01L 27/3206 313/503 |
| 2009/0108743 A1* | 4/2009 | Kobayashi | .......... | H01L 51/5281 313/504 |
| 2010/0255184 A1* | 10/2010 | Yamazaki | ........... | H01L 21/6715 427/66 |
| 2012/0104525 A1* | 5/2012 | Wu | ....................... | G02B 3/0018 257/432 |
| 2012/0223979 A1* | 9/2012 | Matsukura | ............. | G02B 5/223 345/690 |

(Continued)

*Primary Examiner* — Michael Lebentritt
(74) *Attorney, Agent, or Firm* — Andrew C. Cheng

(57) ABSTRACT

The present invention provides an OLED display including a red organic light-emitting element, a green organic light-emitting element, and a blue organic light-emitting element set corresponding to a red filter device, a green filter device, and a blue filter device respectively. Thus, the chromaticity coordinate of the OLED display can be adjusted and NTSC can be increased. Selection of material made of the red, green, and blue light-emitting elements and light-utilizing efficiency are increased.

10 Claims, 2 Drawing Sheets

(56) References Cited

U.S. PATENT DOCUMENTS

| | | | |
|---|---|---|---|
| 2012/0229014 A1* | 9/2012 | Shiratori | H01L 27/3216 |
| | | | 313/498 |
| 2012/0319569 A1* | 12/2012 | Okamoto | H01L 27/322 |
| | | | 313/504 |
| 2014/0232962 A1* | 8/2014 | Ishida | H01L 25/167 |
| | | | 349/42 |
| 2015/0200212 A1* | 7/2015 | Xun | H01L 27/1225 |
| | | | 257/43 |
| 2015/0372036 A1* | 12/2015 | Suh | H01L 27/1462 |
| | | | 348/273 |
| 2016/0172426 A1* | 6/2016 | Kim | H01L 51/56 |
| | | | 257/40 |
| 2017/0025482 A1* | 1/2017 | Choi | H01L 51/5281 |
| 2017/0045654 A1* | 2/2017 | Kim | G02B 5/223 |

\* cited by examiner

OLED DISPLAY

BACKGROUND

Technical Field

The present invention relates to displaying field, and more particularly, to an organic light-emitting diode (OLED) display.

Description of Related Art

An organic light-emitting diode (OLED) can emit light actively so it does not need backlight source. The OLED has high ratio, thin thickness, wide viewing angle, fast respond, simple structure, wide temperature range, and is capable of flexible display, etc. Thus, it is deemed as new display technology in next generation.

There are two plans of color expression in the conventional OLED display. First, the OLED display 100 includes an organic light-emitting element 110 emitting red, green, and blue lights in each pixel region. Referring FIG. 1, the organic light-emitting element 110 includes a red light-emitting element 112, a green light-emitting element 113, and a blue light-emitting element 114. The drawback of the first plan is that it is difficult to select material made of the organic light-emitting element 110 emitting different color in each pixel region. That is, selection of material made of the red, green, and blue light-emitting elements that satisfies light-emitting efficiency, life, and color is few.

Second, the OLED display 200 includes an organic light-emitting element 210 emitting white light cooperating with a color filter 220 in all pixel regions. Namely, the white light-emitting layer 210 cooperates with the color filter 220. Referring FIG. 2, the top light-emitting OLED display 200 includes an array substrate 201 and the color filter 220. The color filter 220 includes a red color resist 221, a green color resist 222, and a blue r resist 223 and the white light-emitting layer 210 is on the array substrate 201. White light emitted from the white light-emitting layer 210 passes the color filter 220 and expresses RGB. However, the plan of the white organic light-emitting element 210 cooperating with the color filter 220 has problem that light-utilizing efficiency is decreased dramatically. The light-utilizing efficiency is about ⅓.

Thus, it is urgent to provide a plan that can satisfies both selection of material made of the red, green, and blue light-emitting elements and increasing light-utilizing efficiency.

SUMMARY

The present invention provides organic light-emitting diode (OLED) display which can adjusted the chromaticity coordinate of the OLED display and national television standards committee (NTSC) can be increased. Selection of material made of the red, green, and blue light-emitting elements and light-utilizing efficiency are increased.

To resolve the aforementioned problem, the present invention provides an OLED display including an array substrate, including a plurality of organic light-emitting elements; and a color filter opposite to the array substrate, including a plurality of filter devices; wherein the plurality of organic light-emitting elements is set corresponding to the plurality of filter devices and emits the same color as that of the plurality of filter devices respectively.

The plurality of organic light-emitting elements includes a red organic light-emitting element, a green organic light-emitting element, and a blue organic light-emitting element. The plurality of filter devices includes a red filter device, a green filter device, and a blue filter device.

The array substrate further includes a reflective layer and a transparent layer. The organic light-emitting elements are set between the reflective layer and the transparent layer, wherein the transparent layer is set on the lateral surface of the organic light-emitting elements facing the filter device, and the reflective layer is set on the lateral surface of the organic light-emitting elements backward the filter device.

A thin film encapsulant is between the color filter and the transparent layer.

A desiccant is between the color filter and the thin film encapsulant.

The array substrate further includes a pixel-limited layer set between any two of the red organic light-emitting element, the green organic light-emitting element, and the blue organic light-emitting element.

The color filter includes a black matrix set corresponding to the pixel-limited layer.

The array substrate includes a bottom substrate; a buffer layer on the bottom substrate; a plurality of TFT on the buffer layer; and a flat layer on the plurality of TFT, including through holes.

The reflective layers are set on the flat layer and are electrically connected with the TFTs via the through holes.

The plurality of organic light-emitting elements is on the reflective layers.

The color filter further includes a substrate, the filter devices and the black matrix on the substrate.

The benefit of the present invention is that it distinguishes from the conventional art. The present invention provides the OLED display including the red organic light-emitting element, the green organic light-emitting element, and the blue organic light-emitting element set corresponding to the red filter device, the green filter device, and the blue filter device respectively. Thus, the chromaticity coordinate of the OLED display can be adjusted and NTSC can be increased. Selection of material made of the red, green, and blue light-emitting elements and light-utilizing efficiency are increased.

BRIEF DESCRIPTION OF THE DRAWINGS

The accompanying drawings are included to provide easy understanding of the application, are incorporated herein and constitute a part of this specification. The drawings illustrate embodiments of the application and, together with the description, serve to illustrate the principles of the application.

DESCRIPTION OF THE PREFERRED EMBODIMENTS

To better and concisely explain the disclosure, the same name or the same reference number given or appeared in different paragraphs or figures along the specification should has the same or equivalent meanings while it is once defined anywhere of the disclosure.

Figure 1:
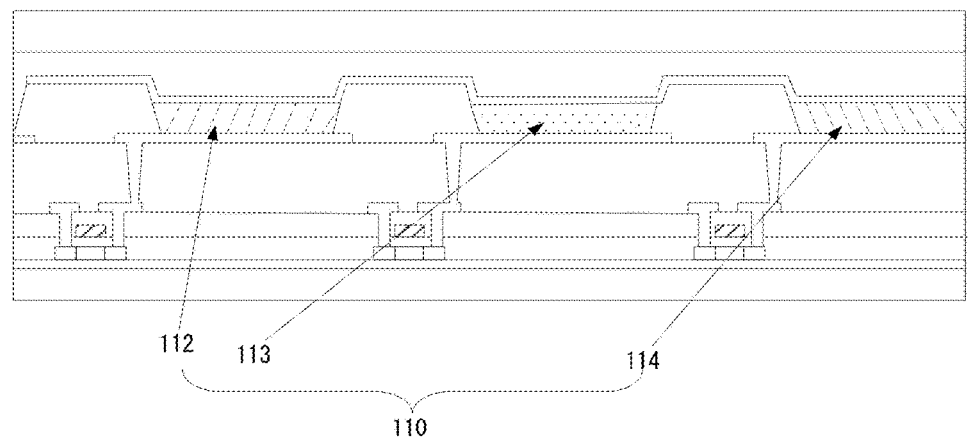
FIG. 1 is a cross-sectional view of a conventional OLED display.
Figure 2:
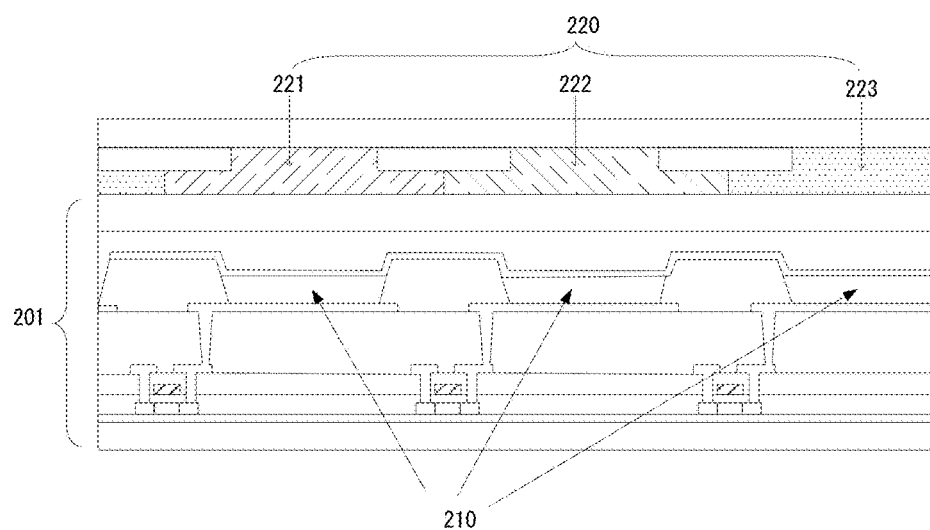
FIG. 2 is a cross-sectional view of another conventional OLED display.
Figure 3:
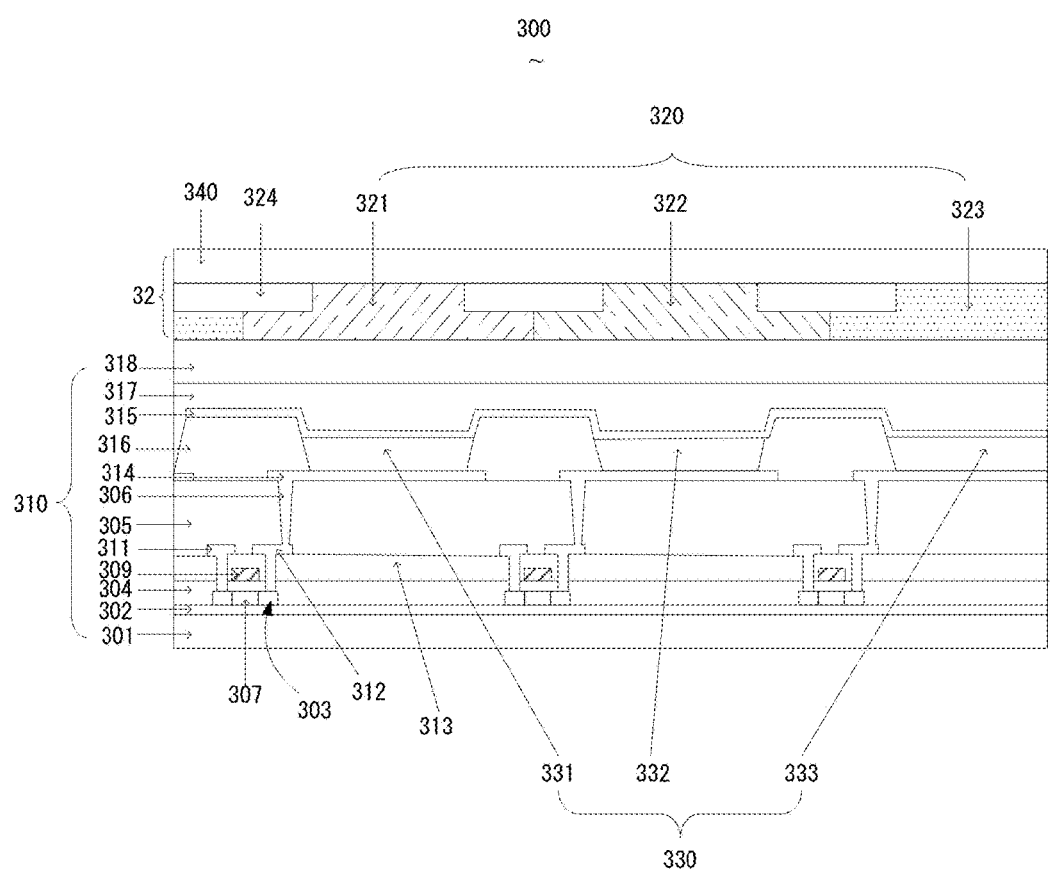
FIG. 3 is a cross-sectional view of an OLED display in accordance with an embodiment of the present invention.

FIG. 3 is a cross-sectional view of an organic light-emitting diode (OLED) display in accordance with an embodiment of the present invention. The OLED display 300 includes an array substrate 310 and a color filter 32 opposite to the array substrate 310. The color filter 32 includes a plurality of filter devices 320. Material of filter device 320 includes but is not limited resin. The resin is organic material and can filter color The array substrate 310 has a plurality of organic light-emitting elements 330 set corresponding to the plurality of filter devices 320 respectively. The light color from the plurality of organic light-emitting elements 330 is the same as that of the plurality of filter devices 320 respectively. The plurality of organic light-emitting elements 330 includes a red organic light-emitting element 331, a green organic light-emitting element 332, and a blue organic light-emitting element 333. The plurality of filter devices 320 includes a red filter device 321, a green filter device 322, and a blue filter device 323. The red organic light-emitting element 331 is set corresponding to the red filter device 321, the green organic light-emitting element 332 is set corresponding to the green filter device 322, and the blue organic light-emitting element 333 is set corresponding to the blue filter device 323. The red filter device 321 is set on the red organic light-emitting element 331 to filter red light from the red organic light-emitting element 331. The green filter device 322 is set on the green organic light-emitting element 332 to filter green light from the green organic light-emitting element 332. The blue filter device 323 is set on the blue organic light-emitting element 333 to filter blue light from the blue organic light-emitting element 333. Thus, the filter devices 320 can filter lights of specific wavelengths which are expected and emitted from the red organic light-emitting element 331, the green organic light-emitting element 332, and the blue organic light-emitting element 333 in this embodiment. The light-emitting efficiency and life are increased, and selection of the organic light-emitting elements 330 material is increased.

In this embodiment, the array substrate 310 is a conventional top gate thin film transistor (TFT). There are a bottom substrate 301, a buffer layer 302 on the bottom substrate 301, and a plurality of TFTs 303 on the buffer layer 302, wherein the TFT 303 is TFT active matrix. The TFT 303 includes a semiconductor layer 307 on the buffer layer 302, a gate insulating layer 304 covering the semiconductor layer 307 on the buffer layer 302, a gate 309 on the gate insulating layer 304 and set corresponding to the semiconductor layer 307. The TFT 303 also includes a source 311 and a drain 312 set on lateral sides of the semiconductor layer 307.

The array substrate 310 includes a flat layer 305 covering the plurality of TFTs 303, wherein there is an inter-layer insulating layer 313 between the flat layer 305 and the gate insulating layer 304. The flat layer covers the source 311 and drain 312 and is on the inter-layer insulating layer 313. The flat layer 305 includes a through hole 306.

The array substrate 310 further includes a reflective layer 314, a transparent layer 315, and a pixel-limited layer 316. The organic light-emitting elements 330 is set between the reflective layer 314 and the transparent layer 315. The transparent layer 315 is set on the lateral surface of the organic light-emitting elements 330 facing the filter device 320. The reflective layer 314 is set on the lateral surface of the organic light-emitting elements 330 backward the filter device 320. The pixel-limited layer 316 is set between any two of the red organic light-emitting element 331, the green organic light-emitting element 332, and the blue organic light-emitting element 333. The reflective layers 314 can be an anode layer, are set on the flat layer 305 with spaces therebetween, and are electrically connected with the drains 312 of the TFTs 303 via the through holes 306 of the flat layer 305. The reflective layer 314 is made of Au, Pt, Ni, W, Cr, Mo, Fe, Co, Cu, Pd, Ti, and the compound thereof in some embodiments. The reflective layer 314 can further includes at least one transparent film made of ITO, IZO, AZO, or ZnO with high work function. The red organic light-emitting element 331, the green organic light-emitting element 332, and the blue organic light-emitting element 333 are set on the reflective layer 314 in order. The pixel-limited layers 316 are set between the red organic light-emitting element 331 and the green organic light-emitting element 332, between the green organic light-emitting element 332 and the blue organic light-emitting element 333, and between the blue organic light-emitting element 333 and the red organic light-emitting element 331. The transparent layer 315 is set on and covers the pixel-limited layers 316 and the organic light-emitting elements 330, and can be cathode layer. The transparent layer 315 includes a transparent metal made of alloy of Mg and Ag, LiF and Al, or Li and Al, or metal of Li, Ca, Ag, and Al. The color filter 32 is set on the transparent layer 315 and there are a thin film encapsulant 317 and a desiccant 318 between the color filter 32 and the transparent layer 315. The structure is that the thin film encapsulant 317 is set on the transparent layer 315, the desiccant 318 is set on the thin film encapsulant 317, and the color filter 32 is set on the desiccant 318. The thin film encapsulant 317 includes many organic layers and inorganic layers stacked alternatively. The organic layer includes a single layer or stack layer made of polyethylene terephthalate (PET), polyimide (PI), polycarbonate (PC), epoxy, polyethylene (PE), and/or acrylate. The inorganic layer includes metal oxide, or a single layer or stack layer made of metal oxide. For example, the inorganic layer can include one of $SiN_x$, $Al_2O_3$, $SiO_2$, and $TiO_2$. The desiccant 318 can be any material absorbing moisture such as $CuSO_4$, $CoCl_2$, glycerine, trimethylolpropane (TMP), triethanolamine (TEOA), or polyethylene glycol (PEG). The thin film encapsulant 317 prevents the OLED display 300 from moisture. The desiccant 318 can absorb the moisture of the OLED display 300.

Moreover, there is a black matrix 324 set on the color filter 32. The black matrix 324 is set corresponding to the pixel-limited layers 316 and is to block light emitted from the organic light-emitting elements 330 toward two lateral sides of the filter device 320 to avoid color mixing. Preferably, thickness of the black matrix 324 is smaller than or the same as that of the filter device 320.

Furthermore, the color filter 32 includes substrate 340 where the filter device 320 and the black matrix 324 are set.

In another embodiment, the TFT can be a conventional bottom gate thin film transistor.

The OLED display 300 can be applied to display device of displaying such as cell phone, tablet, television, display, and global positioning system.

In summary, the red organic light-emitting element, the green organic light-emitting element, and the blue organic light-emitting element are set corresponding to the red filter device, the green filter device, and the blue filter device respectively. Thus, the chromaticity coordinate of the OLED display can be adjusted and NTSC can be increased. Selection of material made of the red, green, and blue light-emitting elements and light-utilizing efficiency are increased.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. An organic LED (OLED) display, comprising:
   an array substrate, comprising a plurality of organic light-emitting elements; and
   a color filter opposite to the array substrate, comprising a plurality of filter devices;
   wherein the plurality of organic light-emitting elements is set corresponding to the plurality of filter devices and emit the same color as that of the plurality of filter devices respectively: and
   the array substrate comprises a reflective layer and a transparent layer, and the organic light-emitting elements are disposed between the reflective layer and the transparent layer.

2. The OLED display of claim 1, wherein the plurality of organic light-emitting elements comprises a red organic light-emitting element, a green organic light-emitting element, and a blue organic light-emitting element, and the plurality of filter devices comprises a red filter device, a green filter device, and a blue filter device.

3. The OLED display of claim 2, wherein the transparent layer is set on the lateral surface of the organic light-emitting elements facing the filter device, and the reflective layer is set on the lateral surface of the organic light-emitting elements backward the filter device.

4. The OLED display of claim 3, wherein a thin film encapsulant is between the color filter and the transparent layer.

5. The OLED display of claim 4, wherein a desiccant is between the color filter and the thin film encapsulant.

6. The OLED display of claim 3, wherein the array substrate comprises a pixel-limited layer set between any two of the red organic light-emitting element, the green organic light-emitting element, and the blue organic light-emitting element.

7. The OLED display of claim 6, wherein the color filter comprises a black matrix set corresponding to the pixel-limited layer.

8. The OLED display of claim 3, wherein the array substrate comprises:
   a bottom substrate;
   a buffer layer on the bottom substrate;
   a plurality of TFT on the buffer layer; and
   a flat layer covering the plurality of TFT, comprising through holes.

9. The OLED display of claim 8, wherein the reflective layers are set on the flat layer with spaces therebetween and are electrically connected with the TFTs via the through holes, and the plurality of organic light-emitting elements is on the reflective layer.

10. The OLED display of claim 7, wherein the color filter comprises a substrate, the filter devices and the black matrix on the substrate.

* * * * *